(12) United States Patent
Cho et al.

(10) Patent No.: US 8,087,920 B2
(45) Date of Patent: Jan. 3, 2012

(54) PROCESS AND APPARATUS FOR ULTRAVIOLET NANO-IMPRINT LITHOGRAPHY

(75) Inventors: Eun-Hyoung Cho, Seoul (KR); Sung Hoon Choa, Seoul (KR); Jin Seung Sohn, Seoul (KR); Byung Kyu Lee, Seoul (KR); Du Hyun Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1004 days.

(21) Appl. No.: 12/025,375

(22) Filed: Feb. 4, 2008

(65) Prior Publication Data

US 2008/0204684 A1 Aug. 28, 2008

(51) Int. Cl.
*B29C 47/92* (2006.01)
(52) U.S. Cl. ............ 425/150; 425/385; 425/387.1; 425/388; 425/149; 264/496; 977/887

(58) Field of Classification Search ............... 425/150, 425/149, 385, 387.1, 388; 264/496; 977/887
See application file for complete search history.

(56) References Cited

U.S. PATENT DOCUMENTS

| 7,789,653 B2 * | 9/2010 | Iimura et al. ............... 425/385 |
| 2004/0119199 A1 * | 6/2004 | Huang et al. ............... 264/237 |

\* cited by examiner

*Primary Examiner* — Yogendra Gupta
*Assistant Examiner* — Robert J Grun
(74) *Attorney, Agent, or Firm* — Sughrue Mion, PLLC

(57) ABSTRACT

A process and an apparatus for performing a UV nano-imprint lithography are provided. The process uses a polymer pad which allows a uniform application of pressure to a patterned template and an easy removal of a residual resin layer. The apparatus includes a tilt and decentering corrector which allows an accurate alignment of layers during the nano-imprint lithography process.

10 Claims, 18 Drawing Sheets
(7 of 18 Drawing Sheet(s) Filed in Color)

PROCESS AND APPARATUS FOR ULTRAVIOLET NANO-IMPRINT LITHOGRAPHY

CROSS-REFERENCE TO RELATED PATENT APPLICATION

This application claims the benefit of Korean Patent Application No. 10-2007-0014390, filed on Feb. 12, 2007, in the Korean Intellectual Property Office, the disclosure of which is incorporated herein in its entirety by reference.

BACKGROUND OF THE INVENTION

1. Field of the Invention

The present invention relates to nano-imprint lithography, and more particularly to a process and an apparatus for ultraviolet nano-imprint lithography, which accomplishes an accurate layer-layer alignment and an easy removal of residual layers after imprint processes.

2. Description of the Related Art

Photolithography techniques have been used to make most microelectronic devices. However, it is believed that these methods are reaching their limits in resolution. Sub-micron scale lithography has been a critical process in the microelectronics industry. The use of sub-micron scale lithography allows manufacturers to meet the increased demand for smaller and more densely packed electronic components on chips.

There are emerging applications of nanometer scale lithography in the areas of optical electronics and magnetic storage. For example, photonic crystals and high-density patterned magnetic memory of the order of terabytes per square inch require nanometer scale lithography.

For making sub-50 nm structures, photolithography techniques may require the use of very short wavelengths of light (e.g., about 13.2 nm). At these short wavelengths, many common materials may not be optically transparent and therefore imaging systems typically have to be constructed using complicated reflective optics. Furthermore, obtaining a light source that has sufficient output intensity at these wavelengths may be difficult. Such systems may lead to extremely complicated equipment and processes that may be prohibitively expensive. It is believed that high-resolution e-beam lithography techniques, though very precise, may be too slow for high-volume commercial applications.

Since around 1995, a nano-imprint lithography (NIL) technology has been noted as an efficient and economical pattern forming technology. In the nano-imprint lithography, a $SiO_2$ concave-convex pattern (a patterned template or a mold) formed on silicon (Si) is press-transferred to a resist.

By means of this technology, it has become possible to form an ultra-micro pattern on a larger area.

Nano-imprint lithography processes have demonstrated the ability to replicate high-resolution (sub-50 nm) images on substrates using templates that contain images as topography on their surfaces. It is believed that nano-imprint lithography may be an alternative to optical lithography for use in patterning substrates in the manufacture of microelectronic devices, such as MOSFET, MSM, a diffraction grid, optical electronic devices, patterned magnetic media for storage applications. Nano-Imprint lithography techniques may be superior to photolithography, because the former enables a transfer of a total pattern, while the latter does not.

In the nano-imprinting technology, a mold pattern is directly transferred to a substrate using a press. Further, unlike the photolithography process which requires several steps to produce a desired substrate, the nano-imprinting technology, in which a pattern is directly transferred to a substrate by a relatively small number of steps. Thus, this technology appears to be very effective lithography, especially when forming a multi-structure.

In the earliest nano-imprint lithography process, a thin layer of imprint resist (thermoplastic polymer) is spin coated onto a sample substrate. Then the mold, which has predefined topological patterns, is brought into contact with the sample and they are pressed together under certain pressure. When heated up above the glass transition temperature of the polymer, the pattern on the mold is pressed into the melt polymer film. After being cooled down, the mold is separated from the sample and the pattern resist is left on the substrate. A pattern transfer process (Reactive Ion Etching, normally) can be used to transfer the pattern in the resist to the underneath substrate. This process is named Hot Embossing or Thermal Imprint Lithography.

However, the thermal imprint lithography employs high pressure and heat, which require complicate and expensive equipment, causing increase in the cost of manufacture. Also, the thermal imprint lithography is difficult to perform on a large substrate and the substrate is may be distorted or damaged due to the high pressure.

As an alternative to the thermal imprint lithography, an UV assisted Imprint Lithography has been proposed. In the UV assisted Nanoimprint Lithography, a photo(UV) curable liquid resist is applied to the sample substrate and the mold is normally made of transparent material. After the mold and the substrate are pressed together, the resist is cured in UV light and becomes solid. After mold separation, a similar pattern transfer process can be used to transfer the pattern in resist onto the underneath material. This method, which was proposed by C. G. Willson and S. V. Sreenivasan of Texas University, can be carried out a pressure as low as below the normal pressure.

Further, since the curing is performed by the UV treatment, a transparent mold made of quartz material should be used. This method includes a number of advantages over the conventional imprint method, but it is considerably difficult to engrave the nano-size pattern on the quartz mold, and thus the cost for manufacturing the mold is very high. Also, when contacting the curable liquid resist to the mold, air bubbles are trapped to cause defects of the products. Control of such defects can increase costs. Currently, the two imprint methods are dividedly used in the fields of the art, and applied to different technical fields depending on their advantages and disadvantages.

Recently, three topics are emerging with respect to the NIL operation: a first topic is related to a larger area process; a second one is an effective removal of residual layers; and a third one is an alignment of layers. Additionally, there are many efforts to cleanly separate the mold from the substrate and to lower the pressure and the temperature used.

First, with respect to a larger area process, it has been frequently reported that, the process for 4-inch area could be successfully performed without the defects. However, with respect to a wafer larger than that size, there has not been reported that the pattern transfer to such a wafer was completely performed in a single process. It is because the application of the uniform pressure to such a larger area is difficult and because the process is not economic owing to the expensive mold.

Accordingly, in the recent days, the step-and-repeat method is being widely used, in which an imprint field (die) which is typically much smaller than the full wafer nanoimprint field, is repeatedly imprinted to the substrate with certain step size. In such a method, a wafer having an area over 8 inches in diameter can be theoretically subjected to the process without causing troubles.

Second, the residual layer following imprint appears a universal problem in the molding process. To remove the residual layers, an etching process is needed. This seems to be aggravated particularly in a region with less than 100 nanometers in size. Accordingly, there are needs to effectively remove residual layers.

Third topic is the alignment of layers. In the photolithography processes, the light-exposure process is performed in a non-contact manner, the alignment of layers is not a big issue Therefore, the photolithography process is advantageous when applied to a curved surface or a multi-layered structure. The nano-imprint lithography process, on the other hand, when applied to a curved surface or a multi-layered structure, may not be advantageous because there is higher probability of failing to transfer pattern to the substrate and an accurate alignment of contact (or very close) layers. Use of an alignment marker has been proposed to improve the alignment of layers. The precision currently obtained using such an align marker is a degree of a few hundreds nanometer and there still are needs to improve the alignment.

SUMMARY OF THE INVENTION

The present invention provides a process and an apparatus for ultraviolet nano-imprint lithography, wherein a removal of residual layers is accomplished through an uniform pressure application and a defect due to trapped air is decreased.

Also, the present invention provides a process and an apparatus for ultraviolet nano-imprint lithography, wherein uniform pattern transfer is available for a larger area and the overall process time is significantly reduced.

In accordance with an aspect of the present invention, there is provided a process of UV nano-imprint lithography including the steps of: (a) spin-coating a polymerizable resin on a substrate to form a resin layer on the substrate; (b) providing a mold which has a template on the resin layer; (c) providing a polydimethylsiloxane (PDMS) pad on the mold; (d) applying pressure on top of the PDMS pad using a transparent shaft; (e) radiating UV light through the transparent shaft while applying the pressure to produce a cured resin layer which has a replica pattern, the replica pattern is a replica of the template pattern; (f) separating the mold from the cured resin layer; and (g) removing a residual layer from the substrate.

In one embodiment of the present invention, the resin in step (a) includes surfactant for prevention of de-wetting on the metal-based substrate.

In one embodiment of the present invention, the mold in step (a) includes a quartz mold or a polymer mold.

In one embodiment of the present invention, the quartz mold may be coated with a self-assembled monolayer (SAM).

In one embodiment of the present invention, the self assembled monolayer coating is obtained using a gas phase treatment in that the metal-based substrate is exposed to reactive vapor in a vacuum state.

In one embodiment of the present invention, step (a) further includes increasing stability of a resin coating by treating a surface of the metal-based substrate with hexamethyldisilane (HMDS).

In accordance with another aspect of the present invention, there is provided an apparatus for performing UV nano-imprint lithography, which comprises a vacuum chamber; a tilt and de-centering corrector received in the vacuum chamber, the tilt and de-centering corrector adjusting an alignment of an assembly of a substrate and a resin layer; a UV emitter provided on the tilt and de-centering corrector; and, a UV fiber source which supplies UV light to the UV emitter, wherein the apparatus produces a pattern on the substrate, the pattern being a replica of a template pattern provided on a mold, and the pattern on the substrate is made of the resin layer.

In one embodiment, the tilt and de-centering corrector comprises: a base plate having on its upper surface a concave recess with a curvature; a loading plate disposed over the base plate; a ball placed between the base plate and the loading plate, the ball is in at least partially contact with the base plate and the loading plate; a centering guide disposed over the loading plate and formed with a nesting recess on an upper surface thereof, the centering guide receiving the assembly of the substrate and the resin layer; a plurality of centering guide rods disposed around the centering guide; a mold loading plate provided on the centering guide rod; and a mold arranged on the mold loading plate, the mold having a template pattern. The mold loading place may be provided on the centering guide rod through an elastic means. The assembly of the substrate and the resin layer may further comprise a pad made from polydimethylsiloxane.

In one embodiment of the present invention the concave recess is formed with a diameter larger than that of the ball.

In one embodiment of the present invention the sample includes a substrate and spin-coated resin on the substrate.

In one embodiment of the present invention the UV emitter includes: a support member; a fitting member coupled to the support member; a UV emitting device coupled to an end of the fitting member; and a jig having a shaft provided inside thereof, the shaft applying pressure to the mold to bring the mold to be in contact with the assembly; wherein the fitting member is coupled to the jig.

In an embodiment, the UV emitter includes: a support member having threads formed on the inner circumference thereof; a fitting member threaded into the support member; a UV emitting device having an end threaded into the fitting member; and a jig having an quartz shaft installed inside thereof and the fitting member threaded therein.

In one embodiment of the present invention the support member and the fitting member each have annular shapes.

In one embodiment of the present invention the apparatus further includes a fine haze diffuser film (FHDF) mounted on an upper surface of the transparent shaft for uniform application of UV light. The transparent shaft may be a quartz shaft.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
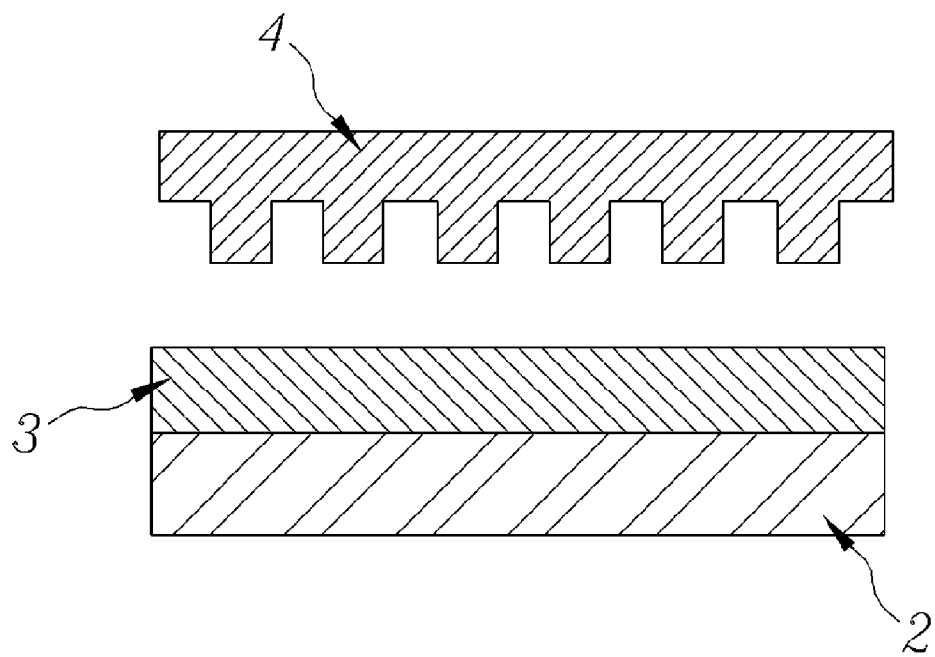
FIGS. 1A-1F illustrate overall processes of UV nano-imprint lithography according to an embodiment of the present invention.
Figure 1B:
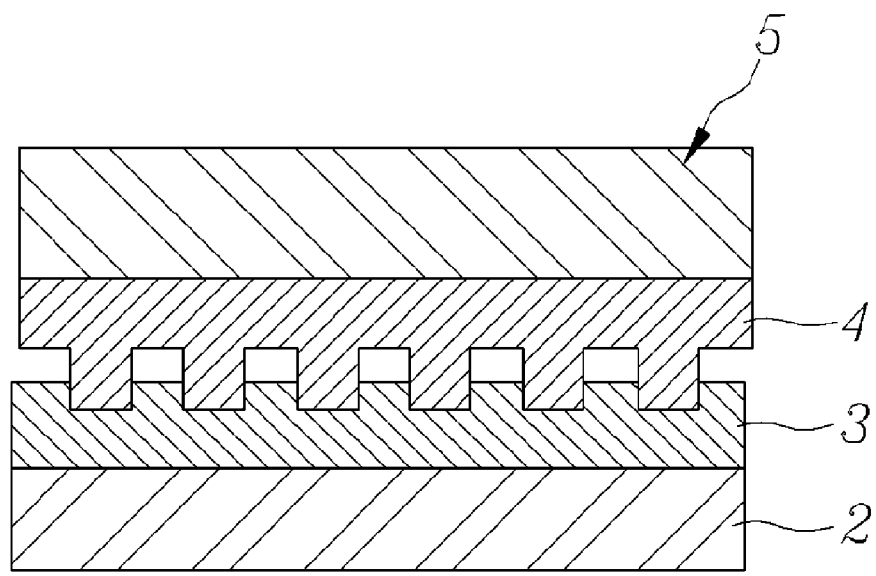

Hereinafter, embodiments of the present invention will be described with reference to the accompanying drawings. In the following description and drawings, the same reference numerals are used to designate the same or similar components, and so repetition of the description on the same or similar components will be omitted.

In an embodiment of the present invention, a UV-NIL method may be carried out under a lower temperature (room temperature) and a lower pressure than the conventional thermal transfer method. FIG. 1 illustrates overall processes of the UV-nano imprint lithography process. The substrate 2 may be a metal-based substrate. It may be, for example a semiconductor wafer. A mold which has a template pattern (or a patterned template) made from transparent quartz or polymer is used. UV light is applied through the mold to a resin layer, which is disposed below the mold. Conventionally, the quartz mold is manufactured by coating an E-beam reactive polymer on a quartz bare wafer having a thin Cr layer, patterning and developing the wafer through the E-beam lithography, and then dry-etching the wafer.

The quartz mold may be coated with a self assembled monolayer (SAM) to ease a release of the mold after the resin layer is cured, leaving a relief image on the surface of the substrate that is a replica of the template pattern. The SAM coating can be performed in three different ways. First, the substrate may be dipped or immersed into a solution containing a ligand or a precursor, which is reactive with the substrate. It takes about 12 hours for completion.

Second, the above-mentioned solution may be spin coated. However, it is difficult to uniformly coat the solution over the whole surface of the mold. Third, a gas phase treatment may be used, in which the mold is exposed to reactive vapor in a vacuum state.

It is reported that the third one is likely the most reliable way for the SAM coating among the three ways. If the mold is of nano-size pattern, it is more appropriate to employ the gas phase treatment, since the pattern may be distorted while coating the SAM. The reactive material used for coating SAM, i.e., the ligand or the precursor, may be varied according to types of the mold.

When using the quartz mold, $RSiCl_3$ or $RSi(OR')_3$ is used as the ligand, wherein an anchoring group chemically bonded with the substrate includes $—SiCl_3$ or $Si(OR')_3$ and R includes fluorine group having excellent oil repellent and water repellent properties. As an example, Tridecafluoro-1,1,2,2-Tetrahydrooctyl-Trichlorosilane $[CF_3—(CF_2)_5—CH_2—CH_2—SiCl_3]$ (FOTCS) (Gelest, Inc) may be used, which is dissolved into anhydrous, n-Heptane($C_7H_6$) solvent to be used as 1 ppm solution.

The n-heptane is vaporized to serve as a medium for assisting the SAM ligand to be adsorbed to the mold in the vapor state of the n-heptane. Since FOTCS is very sensitive to moisture, it should be anhydrous. Otherwise, molecules would contact the moisture to thereby cause a chemical reaction. As a result, the molecules may be conglomerated and a milky phenomenon would occur in a liquid state. If the SAM coating is performed in this state or if the moisture is absorbed to thereby completely cover the surface of the mold pattern while performing the SAM coating, there would be a possibility of pattern distortion.

Before the SAM coating, the surface of the mold needs to be cleaned and have large number of silanol (Si—OH) groups. In order to provide such conditions, oxygen ($O_2$) plasma ashing may be carried out for 5 to 10 seconds. By means of the oxygen plasma ashing, $—OH^-$ base is distributed on the surface of the quartz mold, resulting a hydrophilic surface. When a SAM solution is introduced into a vacuum chamber and bring into contact with the mold, the SAM ligand reacts with the surface of the substrate, which includes the silanol group in the form of vapor. Accordingly, Cl included in ligand is coupled with H included in the substrate, so that HCl is removed there-from. Further, silicon (Si) of the ligand is chemically coupled with oxygen of the substrate.

The polymerizable resin for patterning used in the UV-NIL has UV-reactivity and low viscosity below 5 cPs. Also, the resin is not easily dried in the air while spin-coating in a solvent-free state. Furthermore, the mechanical strength needs to be maintained after UV curing, and the process is performed under low temperature and low pressure. In addition, the resin is resistant against etching. To meet these conditions, the resin may include an active ingredient, a releasing agent, a viscosity modifier and a photo initiator.

The active ingredient is in the form of a monomer or precursor. The releasing agent is added so as to facilitate release of the mold after the curing. The releasing agent usually has a high viscosity and thus contained in the resin in an appropriate amount so as to prevent wetting or filling onto the mold pattern. A viscosity modifier may be added so as to control the proper amount of such releasing agent. However, since the viscosity modifier has low mechanical strength, the amount thereof may be properly controlled.

The photo initiator readily forms radical ions upon application of the UV-light to break double coupling in the active ingredient and obtain coupling forming chains.

While performing spin-coating, surfactant may be additionally included in order to prevent de-wetting of the resin on the substrate. The surfactant is an organic compound including a hydrophobic group and a hydrophilic group. The surfactant can be dissolved in an organic solvent or water. The surfactant decreases surface tension of the interface between the surface and the fluid so that the surface may be readily wetted with fluid. Here, the substrate of which surface is treated with hexamethyldisilane (HMDS) shows an improved coating stability when a resin layer is formed thereon by, for example, spin-coating.

Figure 1C:
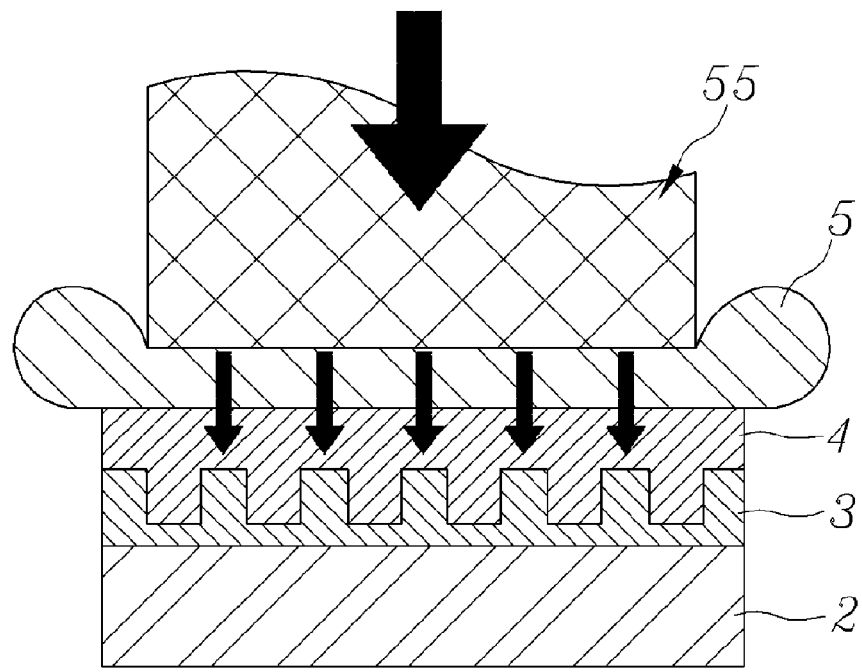
Figure 1D:
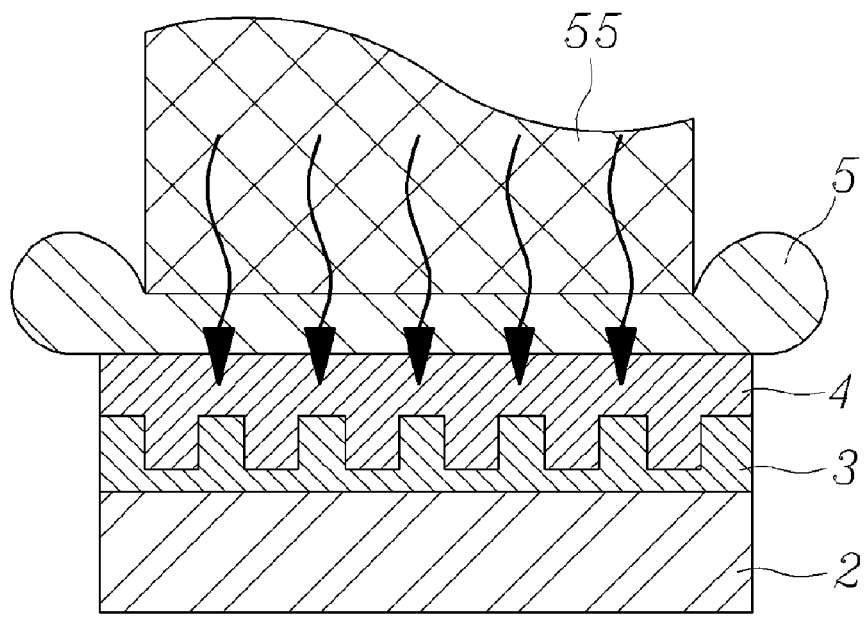
Figure 1E:
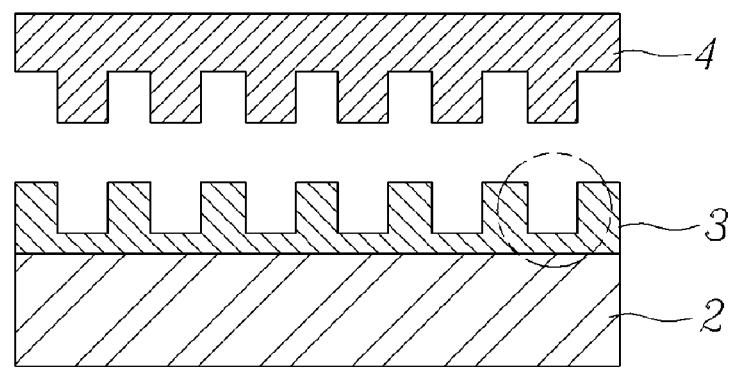
Figure 1F:
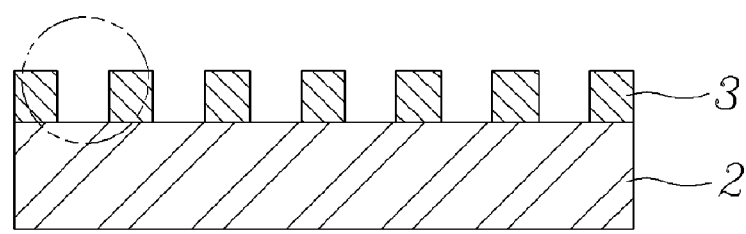

Referring to FIGS. 1A-1F, a metal substrate 2 is spin-coated with a resin 3, and a mold 4 is disposed over the metal substrate 2 (FIG. 1A). The mold has a pattern (template pattern) which will be replicated onto (transferred to) the resin layer. The mold is made of a material which allows a transmission of UV light. A PDMS pad (polydimethylsiloxane pad) 5 is disposed thereon. The PDMS pad enables an application of uniform pressure to the mold (FIG. 1A). Pressure is applied using a shaft 55 which is capable of transmitting UV light (FIG. 1c). The shaft 55 may be a quartz shaft. If the UV light is irradiated through the shaft 55 while applying the pressure, the resin 3 is cured by the UV curing reaction (FIG. 1D). Thereafter, the mold 4 is removed leaving a relief image (pattern) of the resin on the substrate, which the relief image is a replica of the template pattern of the mold. There remains a residual resin layer between steps of the pattern on the substrate (as circled in FIG. 1E). Any residual resin layer can be substantially completely removed by oxygen ashing (FIG. 1F).

Figure 2:
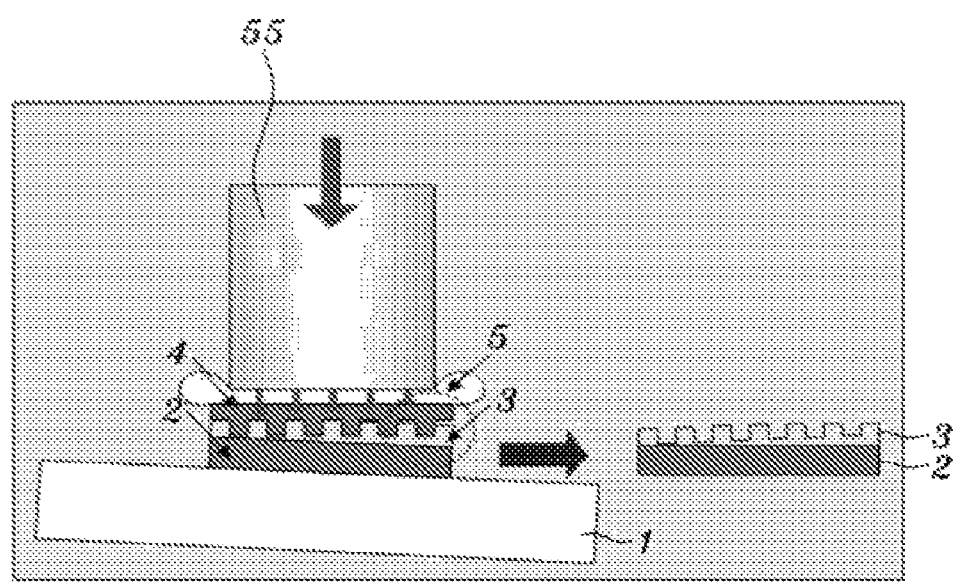
FIG. 2 illustrates a non-uniform pattern formed by a NIL process due to tilt.

In the UV-NIL process illustrated in FIGS. 1A-1F, if there is any tilt between the shaft 55 and a base plate 1 supporting the metal substrate 2 and the resin 3 disposed thereon, a non-uniform pattern may be formed after completing the processes, as illustrated in FIG. 2. Also, if there is tilt, oxygen may be introduced into an edge portion formed between the resin 3 and the mold 4, and thus the radical, which is formed by photo-initiator during the UV-curing, may easily react with the oxygen. As a result, the curing would not be completed at the edge of the pattern, as shown in FIG. 2 with a dotted circle.

Figure 3A:
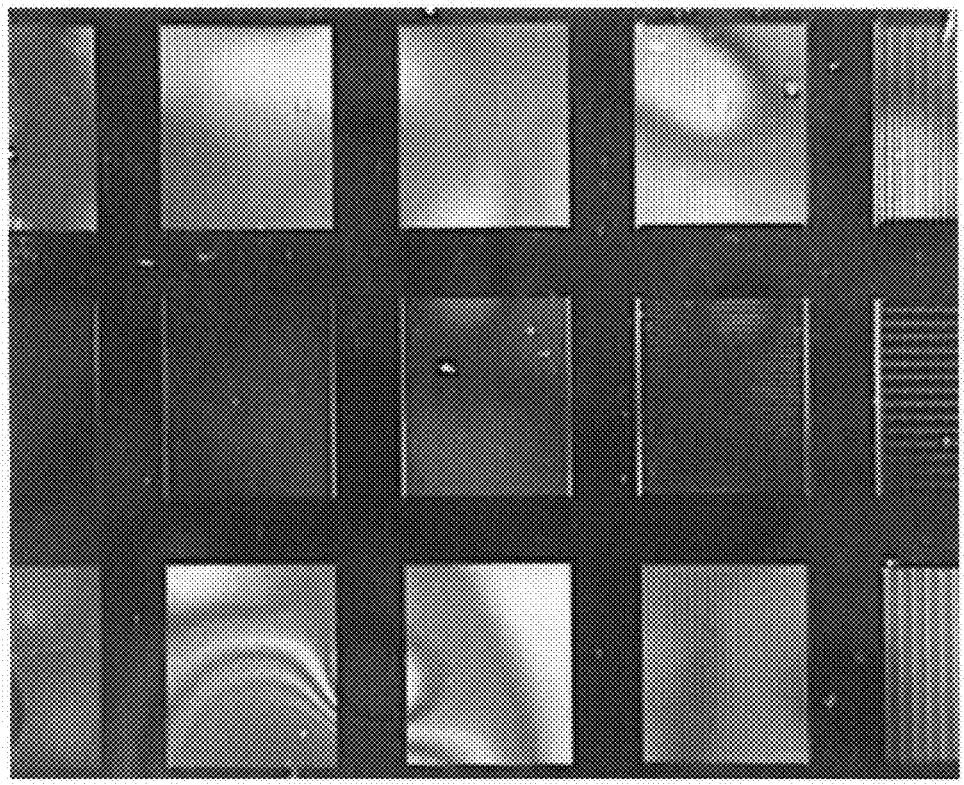
FIGS. 3A and 3B illustrate a non-uniform pattern and an uncured pattern formed by the NIL process due to the tilt.
Figure 3B:
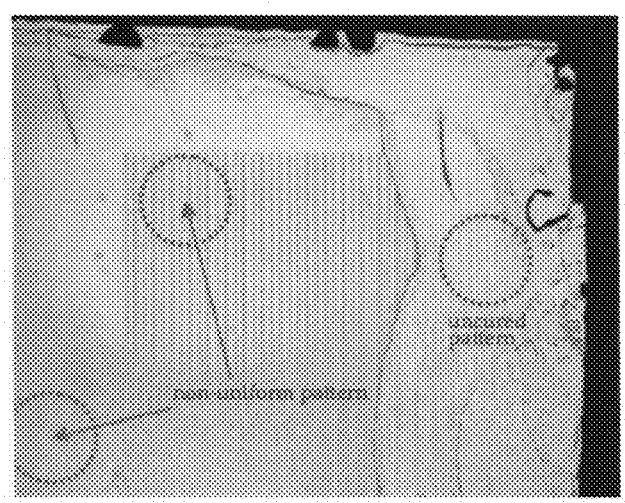

FIGS. 3A and 3B are photographs illustrating a non-uniform pattern and an uncured pattern formed due to tilt. As may be appreciated in the photographs, so-called fringe patterns are observed over the resin layer pattern. The reason why the fringe patterns are optically observed is that height of the pattern is not uniform (FIG. 3B) and that the remaining layer is not completely removed and has non-uniform height.

Figure 4:
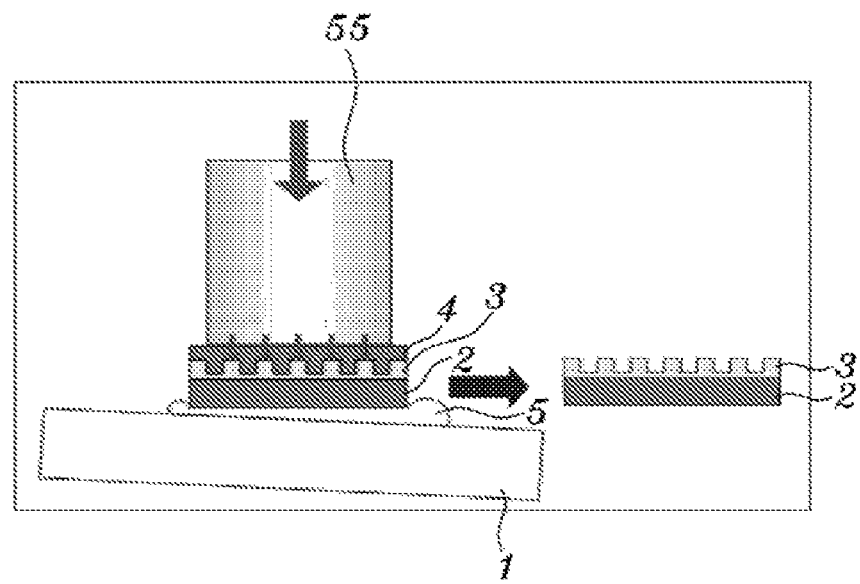
FIG. 4 illustrates a correction of the tilt by changing the location of a PDMS pad.
Figure 5:
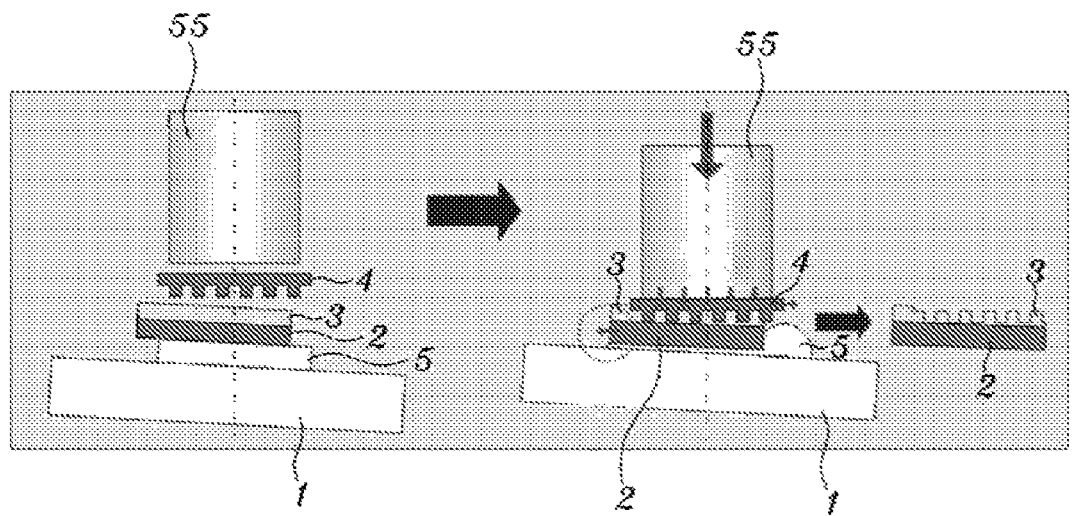
FIG. 5 illustrates non-uniform pattern formed by the NIL process due to de-centering.

Also, there is the uncured portion in the pattern edge as illustrated in FIG. 3B. It is possible to solve the problem occurring in the tilted system by relocating the PDMS pad 5 from a location between the shaft 55 and the mold 4 to the other location between the substrate 2 and the base plate 1, as illustrated in FIG. 4. Non-uniformity of the pattern may be caused by de-centering between the layers of the substrate 2 and resin layer 3, and the mold 4, as illustrated in FIG. 5.

An application of uniform pressure is needed in order to ensure the uniformity of the pattern over a larger area. For its sake, centering between the layers of substrate 2, resin layer 3, and the mold 4 needs to be ensured together with tilt correction, as mentioned herein above.

Figure 6:
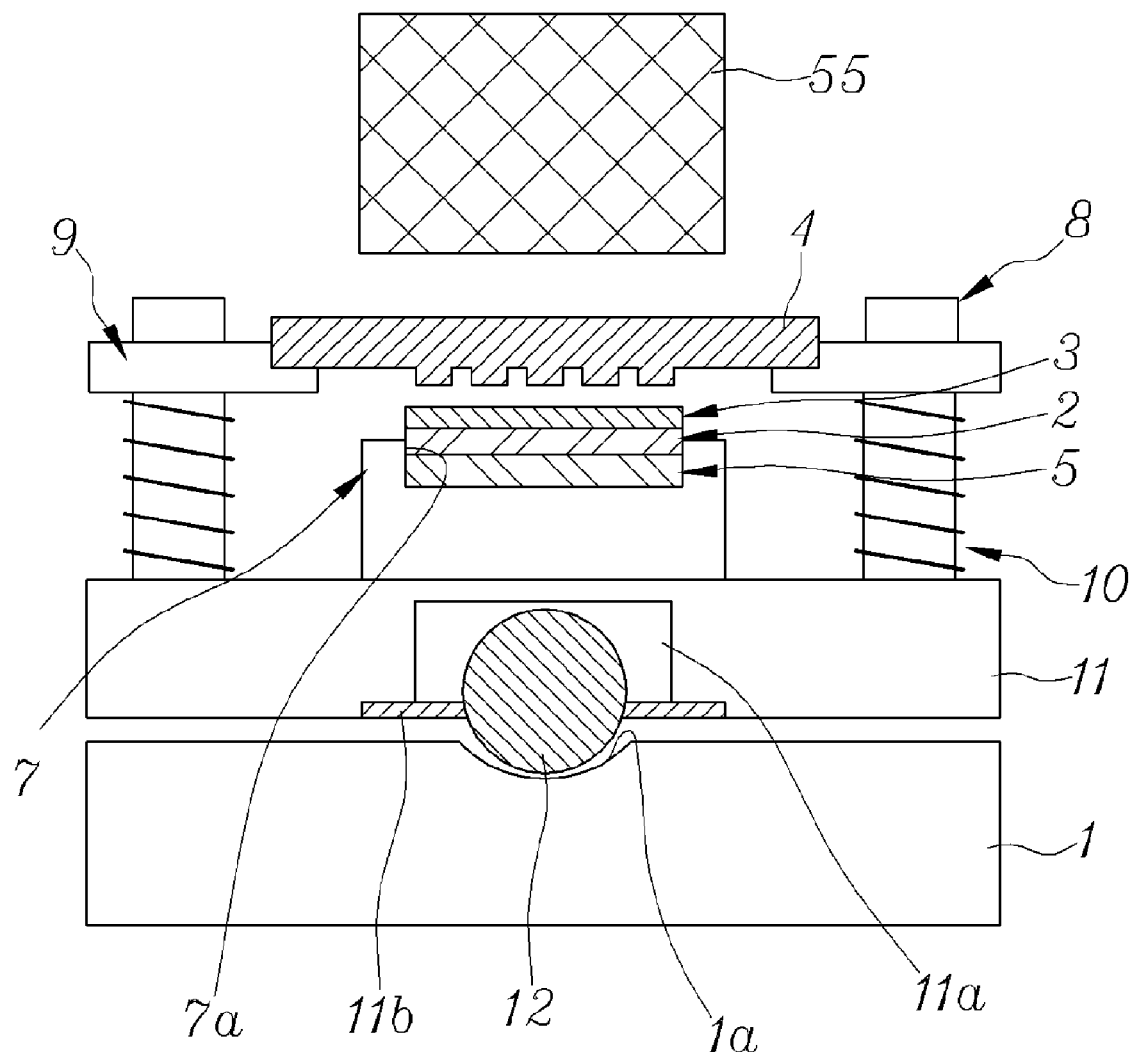
FIG. 6 illustrates a front view of a tilt and de-centering corrector in an apparatus for performing the UV nano-imprint lithography according to an embodiment of the present invention.

According to one embodiment of the present invention, there is proposed a tilt and de-centering corrector for addressing the stated problem, as illustrated in FIG. 6.

The tilt and de-centering corrector includes a base plate 1 formed with a concave recess 1a having a curvature at a central region of an upper surface thereof and a loading plate 11 contacting to the base plate through a ball 12.

Specifically, the loading plate 11 is inwardly formed with a receiving hole 11a to receive a portion of the ball 12 therein, while the other portion of the ball 12 is received in the concave recess 1a. The receiving hole 11a may have a rectangular shape as shown in FIG. 6, but is not limited thereto. The reference numeral 11b indicates a guide for preventing lateral movement due to the ball's rolling.

On the other hand, a centering guide 7 is fixedly installed at a center of an upper surface of the loading plate 11. The upper surface of the centering guide 7 is formed with a nesting groove 7a to nest the PDMS pad 5 and the substrate 2 and resin layer 3 in sequence. Accordingly, it is possible to perform a systematic centering for the substrate and resin layer 3. The nesting grove 7a may have a rectangular shape.

Further, multiple centering guide rods 8 are fixedly installed around the centering guide 7 in a radial direction. For example, three or more centering guide rods 8 may be used. In one example, four centering guide rods may be used. Elastic means like a spring 10 is installed around the circumference of the centering guide rod 8. A mold loading plate 9 is disposed on an upper end of the spring 10, and a quartz mold 4 is arranged on an upper surface of the loading plate 9.

In an embodiment, the size of the concave recess 1a is larger than the diameter of the ball 12. Since minor tilt can be corrected by point contact between the ball 12 and curved surface of the concave 1a, the tilt and the de-centering between the tilt and de-centering corrector and the shaft 55 would be corrected.

Also, it is possible to apply uniform pressure and to complete pressing without de-centering between the mold 4 and the substrate 2 and resin layer 3, since the mold loading plate 9 moves along the centering guide rod 8.

Figure 7A:
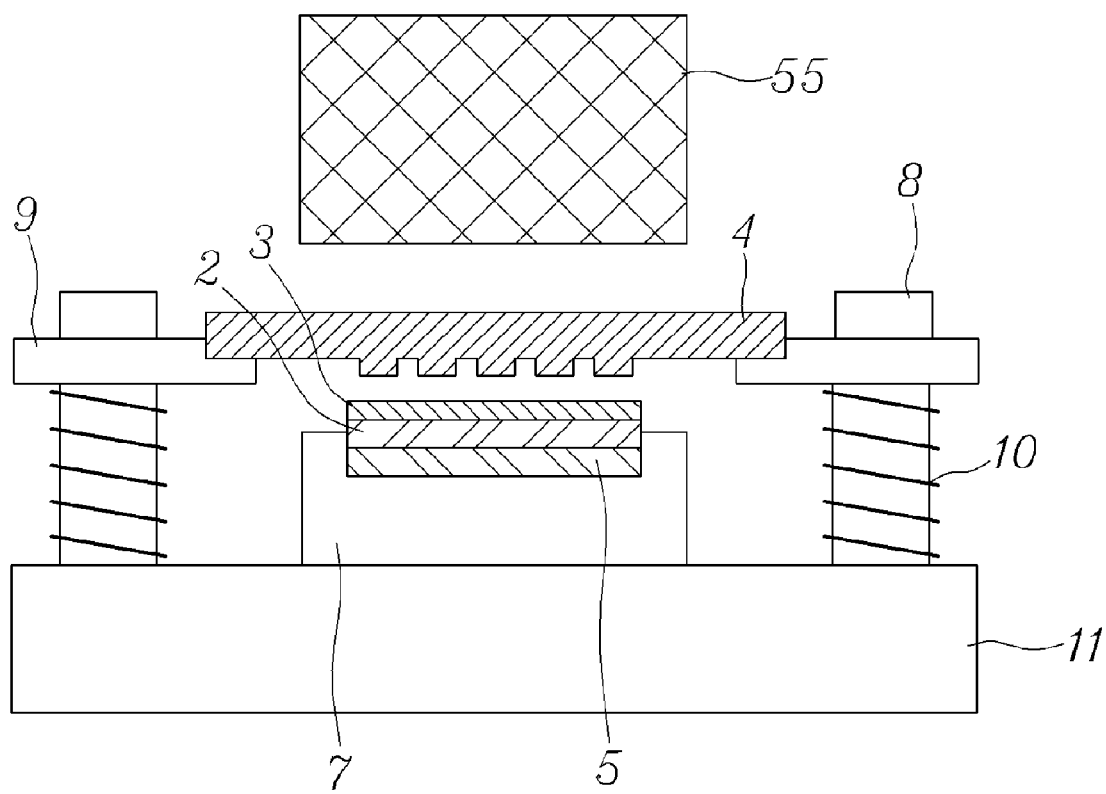
FIGS. 7A-7D illustrate a process for performing the UV nano imprint lithography according to an embodiment of the present invention.
Figure 7B:
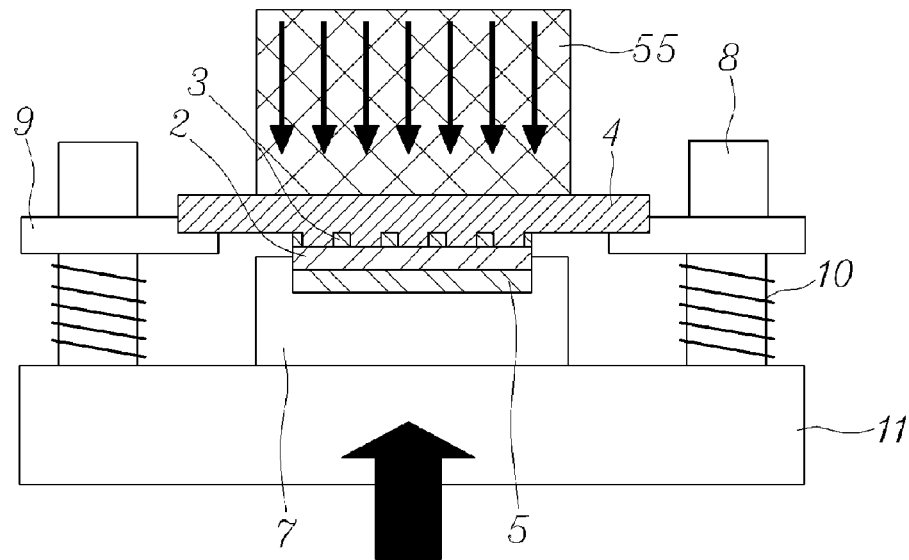

FIGS. 7A-7D illustrate steps for performing the NIL using the tilt and de-centering corrector as shown in FIG. 6. The tilt and de-centering corrector of the present invention can be constructed as a cartridge form, which accompanies additional advantages as described below. As shown in FIG. 7A, there is no contact between the mold 4 and the resin layer 3 before the pressing. The mold 4 and the cartridge loaded with the layer of substrate 3-resin layer 3 are introduced into a vacuum chamber 30 as illustrate in FIG. 9 and then the vacuum chamber 30 is de-aired to become a vacuum state. Thereafter, the process illustrated in FIG. 7B is carried out The contact is attained while pressed in the vacuum state, and thus it is possible to remove the non-uniformity of the pattern, which may caused by trapped air. There is another advantage in that since the tilt and de-centering corrector may have a shape identical to the cartridge, the cartridge can be modified to be matched with various sizes and shapes of the substrate (and resin layer formed thereon) and the molds, which makes it possible to perform the NIL processes to form a pattern on a large substrate.

Figure 9A:
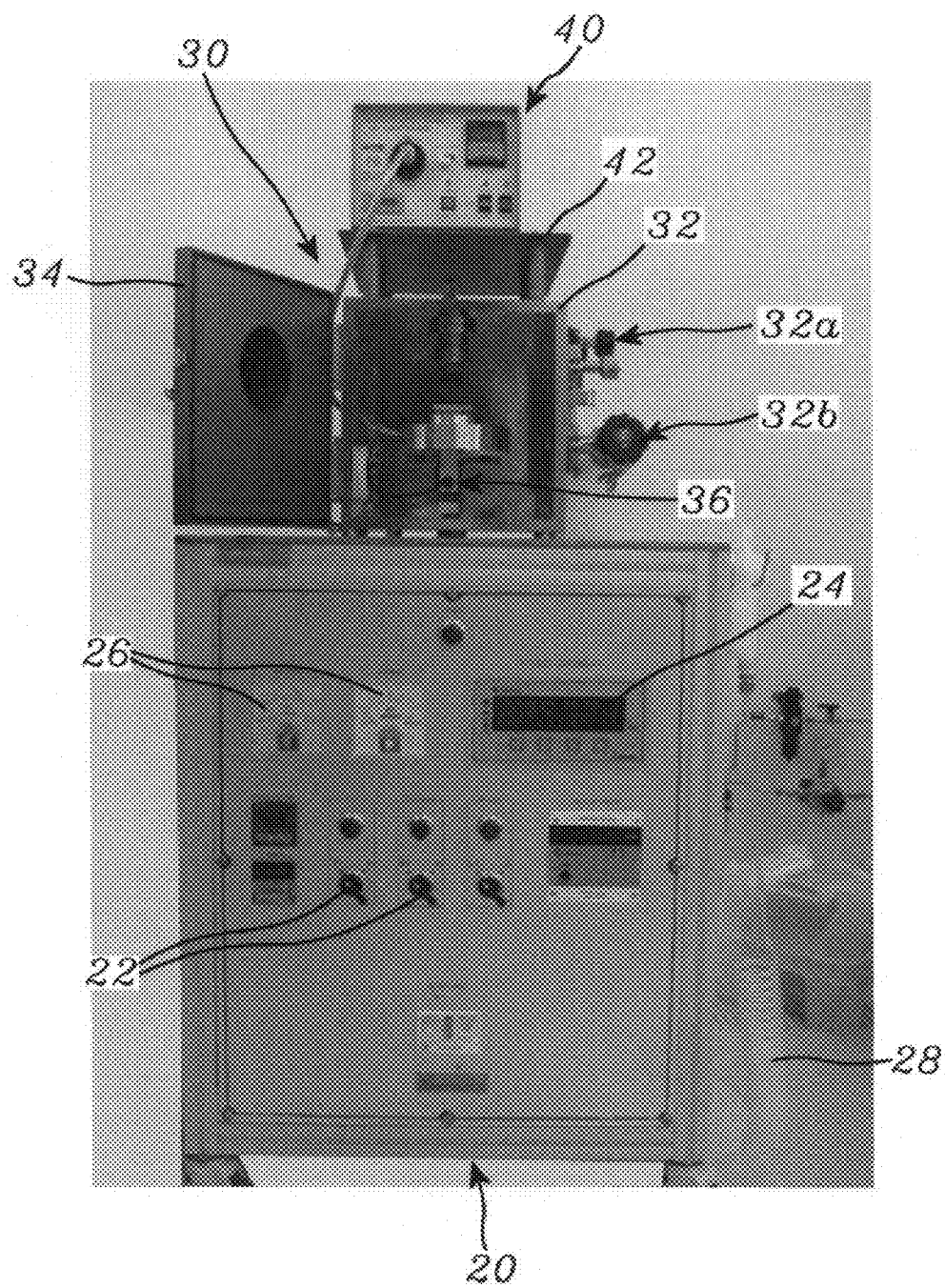
FIG. 9 is a perspective view and a partial enlarged view of the apparatus for performing the UV nano-imprint lithography according to an embodiment of the present invention.
Figure 9B:
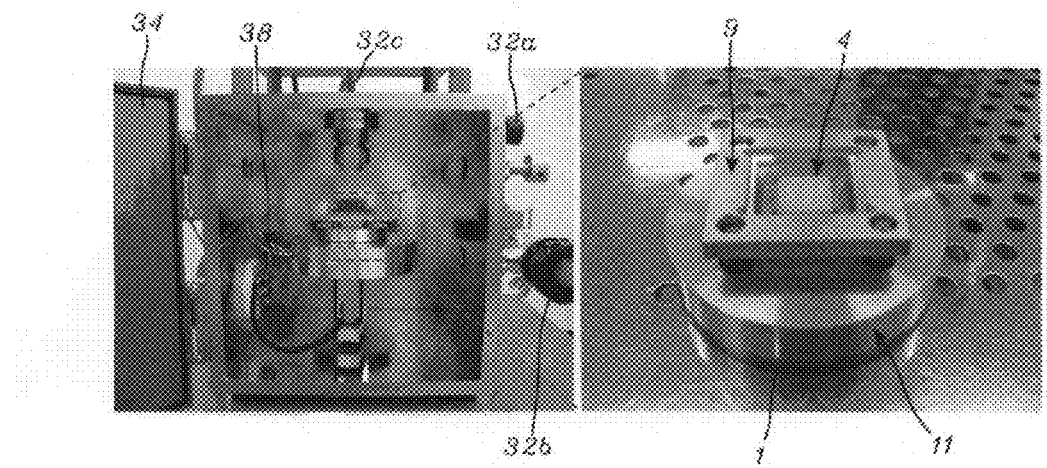

FIG. 9 illustrates structures of an apparatus for performing the UV nano-imprint lithography, according to one exemplary embodiment of the present invention. FIG. 9 shows a specific structure of the apparatus, but as may clearly contemplated by one skilled in the art, the structure may be modified in various ways to perform the UV nano-imprint lithography. In the apparatus of an embodiment as shown in FIG. 9, the vacuum chamber 30 is provided on the upper portion of a controller 20. The controller 20 includes a plurality of operating switches 20 for applying pressure through a pressure cylinder 36 described below, a pressure display window 25 for displaying the pressure as digital numbers and a pressure gauge 26. An air suction device 28 for suctioning air from the vacuum chamber 30 is included at a side of the controller 20.

The vacuum chamber 30 includes a body 32 having a receiving portion and a door 34 hinged to the body 32. At a side of the body 32 are included a vent valve 32a and a vacuum valve 32b, and on an upper surface of the body 32 is included an inlet 32c, to which UV light is supplied from a UV fiber source, as described herein below.

A pressure cylinder 36, to which the pressure is applied as described above, is connected to a lower surface of the body 32, and a UV fiber source 40 is connected to the upper side of the vacuum chamber through a support portion 42.

Figure 7C:
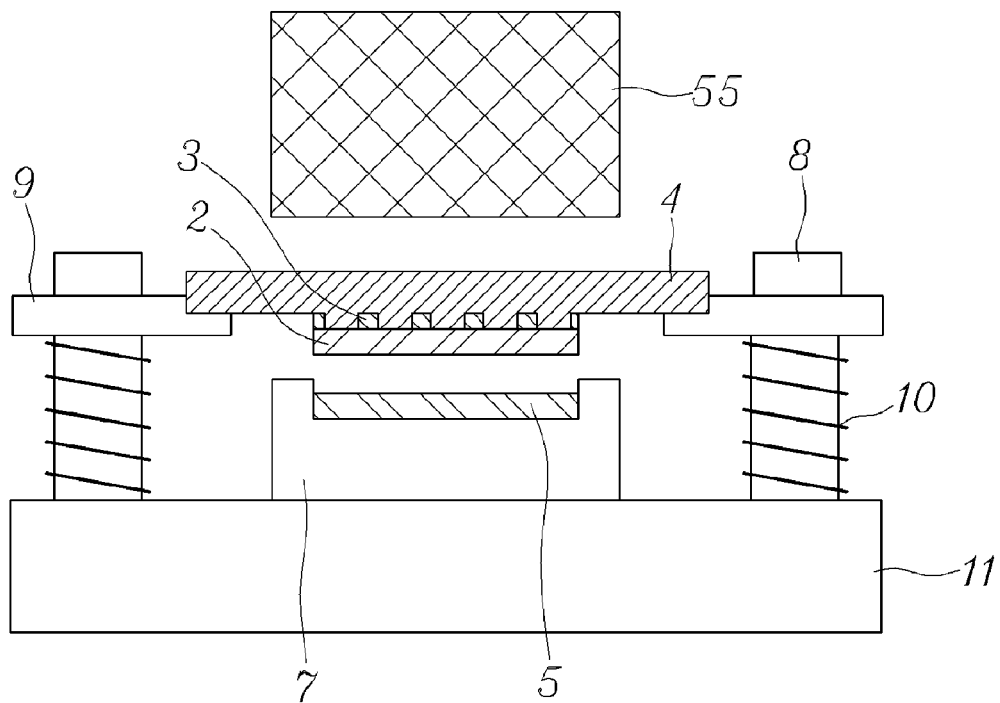
Figure 7D:
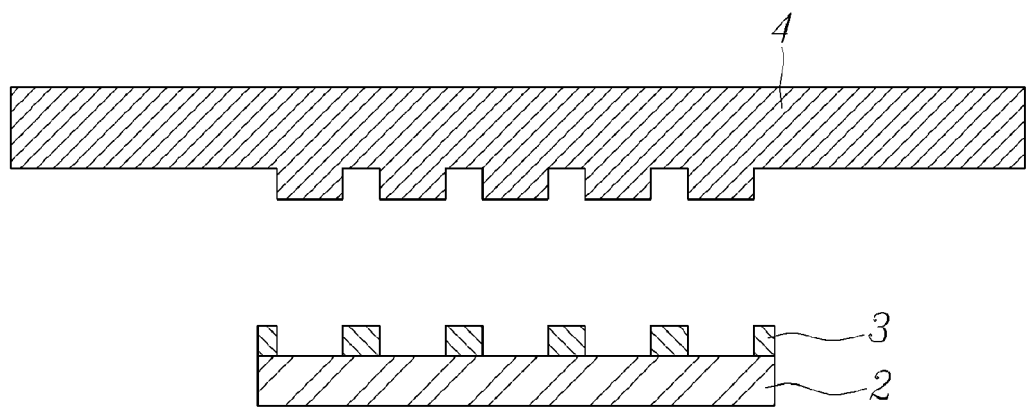

As illustrated in FIGS. 7C, 7D and 9, when the pressure is applied through the underneath pressure cylinder 36 under the vacuum condition and the UV source is applied through the shaft 55, curing is attained. If the pressure of the pressure cylinder 36 is removed after the curing, the cured resin layer 3 and substrate 2 remain attached to the mold 4. A patterned substrate can be easily obtained by de-molding the mold.

The pressure may increase up to 20 bars by means of the pressure cylinder 36, and the UV fiber source 40 capable of outputting high power up to 3000 mW/cm$^2$ is used as the UV fiber source. A heating line (denoted with 38 in FIG. 9) is connected to the loading plate 11 to thereby enable the temperature raise up to about 10° C. The UV NIL process of the present invention may be performed in a room temperature. However, if heat is applied together with the pressure, the viscosity of the resin may be additionally decreased, and thus it is advantageous for pattern filling. Since the patterning process is performed after suctioning air through the air suction device 28 using the vacuum chamber 30 capable of $5 \times 10^{-3}$ Torr, it is possible to avoid such a phenomenon as the non-uniform pattern due, which may caused by air trap.

If the process is performed in the ambient atmosphere, there are problems in that a predetermined time is required for filling of the resin into the pattern, and it takes a longer time to carry out the UV curing. In the present invention, however, since the process is performed without contacting air in the vacuum chamber 20, the process may be completed within a time level of 1/10 (below 1 minute), which is shorter than existing processes.

Accordingly, it is possible to reduce the overall time for the process. Also, as described herein before, since the ball 12 is mounted to the loading plate 11 and the correction of the tilt and the de-centering is attained by the application of the flexible PDMS pad 5, it is possible to apply the uniform pressure.

Figure 8:
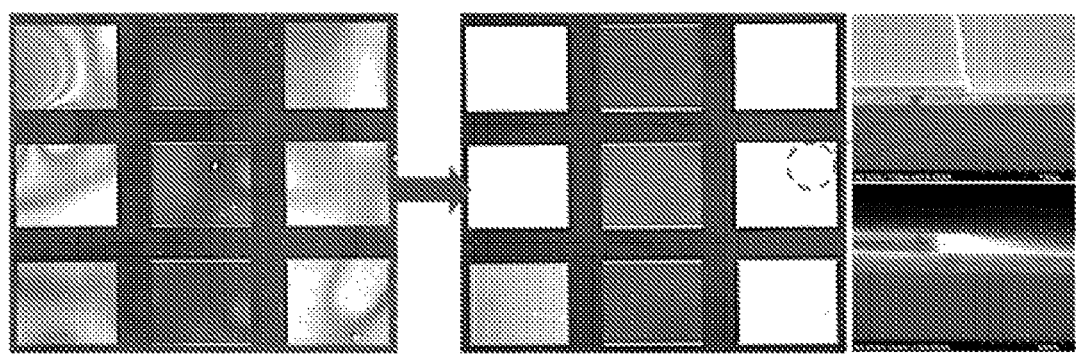
FIG. 8 is a photograph showing the result of the NIL process after correcting the tilt and the de-centering.

FIG. 8 is a photograph showing a result of the NIL process according to an embodiment of the present invention. As may be understood from the picture, the fringe pattern, which is observed before the correction, disappears and the SEM measurement indicates there is no residual layer (Please refer to a dotted circle).

As described above, a mold or a patterned template can be manufactured through the E-beam lithography and etching process, but the etching process is difficult and expensive for nano-size patterns. Since breakage and pollution are unavoidable when performing the NIL operation using an expensive quartz mold, a polymer mold has been proposed in which a quartz mold 4 is formed in a circular shape and a secondary mold is made of a polymer. Basically, the polymer mold has such properties as low critical surface energy and water repellent tendency, and thus there would be no or less problem in releasing the mold after curing if the surface tension of the polymer mold is lower than that of the resin used for patterning.

To facilitate complete release of the mold, the polymer mold may be coated with SAM. Further, it is necessary for the polymer mold to have the relatively high mechanical strength compared to the resin for patterning. Since it is possible to manufacture the polymer mold by UV light curing or thermal curing, a photo-polymerizable or heat-polymerizable polymer may be used.

Figure 10:
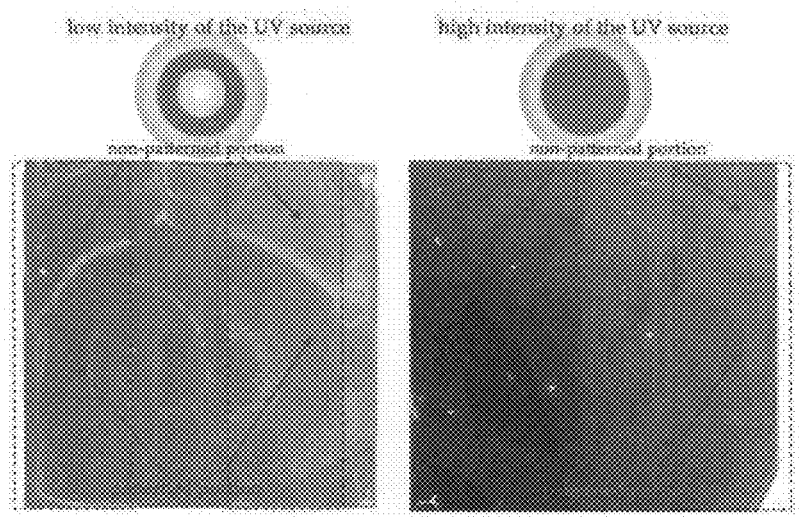
FIG. 10 is a photograph showing a phenomenon of the non-uniform pattern caused by an application of a non-uniform UV source while performing the NIL process using a polymer mold.

FIG. 10 illustrates a view of macroscopic result after performing the NIL processes using the polymer mold. A rectangular dotted line indicates a portion corresponding to the template pattern of the polymer mold. As may be appreciated from the result, it can be ascertained that the patterned portion and the non-patterned portion coexist. Particularly, the patterning condition varies depending on intensity of the UV source, and thus it follows the difference in the intensity of the UV source. Therefore, the uniform application of the UV source is indispensable for attaining the pattern uniformity.

In an embodiment of the present invention, the UV emitter as shown in FIGS. 9-11D is contrived for providing the uniform application of the UV source in order to establish the uniformity of the pattern.

The UV emitter includes an annular support member 51 formed with threads 51a on an inner surface thereof and fixed to an inner side of the body 32, an annular fitting member 52 formed with threads 52a and 52b on an inner and an outer surface thereof, respectively, and screwed to the support member 51 with its outer surface, and a UV emitter portion 53 having a screw portion 53a projected from an end thereof and coupled to the inner surface of the fitting member 52.

Also, the shaft 55 is screwed to inner threads 54a of a jig 54, which has an open upper end and is formed with a through-hole 54b on a bottom side. The outer surface of the fitting member 52 is screwed to the inner surface of the jig 54 at the other side.

Figure 11A:
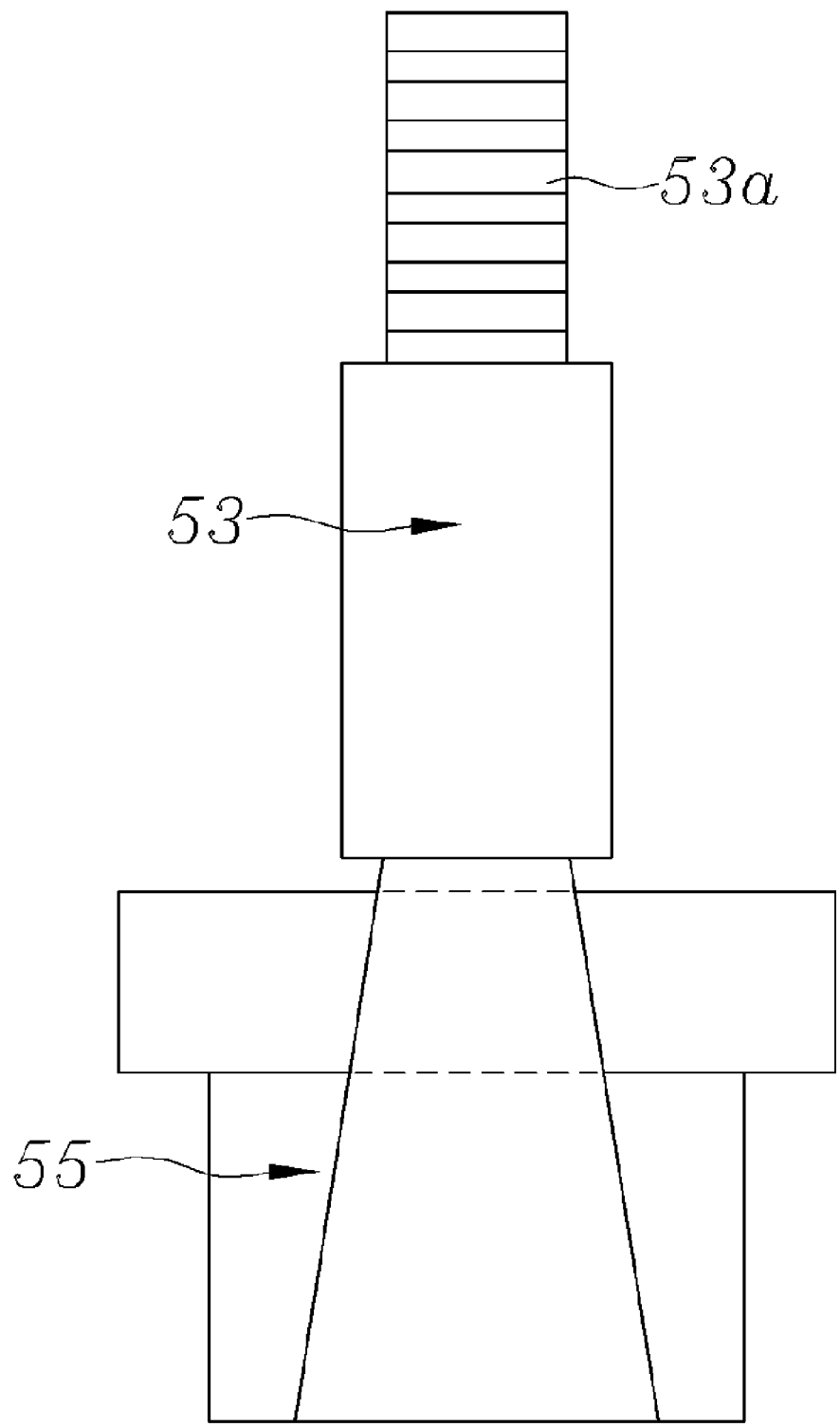
FIG. 11A is a front view of a UV emitter and a quartz shaft included in the apparatus for performing the UV nano-imprint lithography as shown in FIG. 9.
Figure 11B:
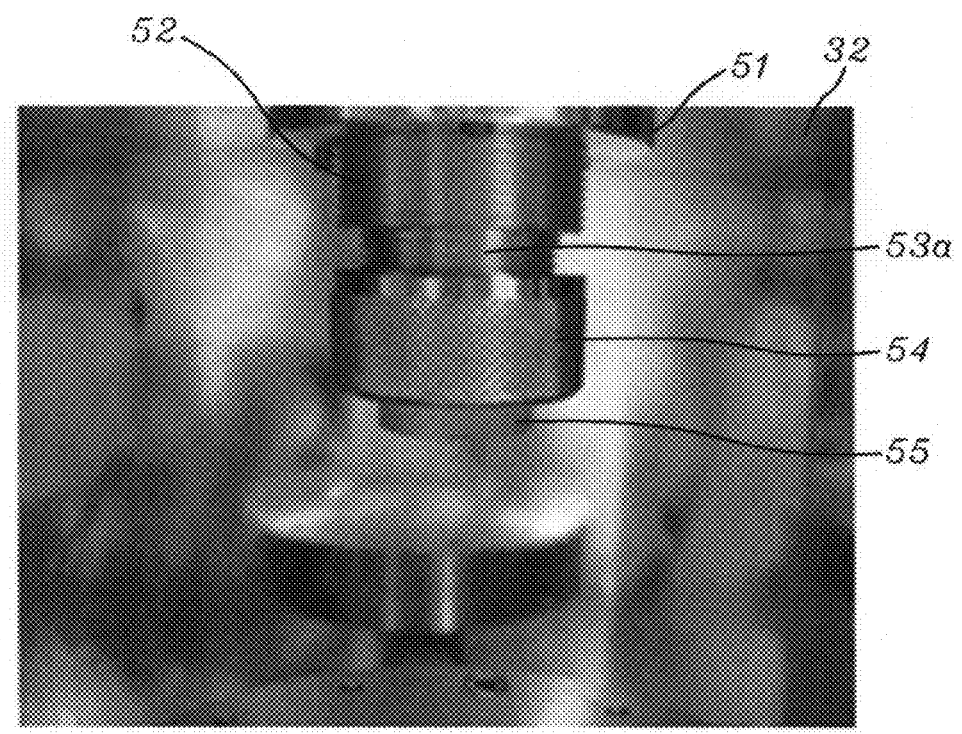
FIG. 11B is a photograph showing the UV emitter included in the apparatus for performing UV-nano imprint lithography according to an embodiment of the present invention.
Figure 11C:
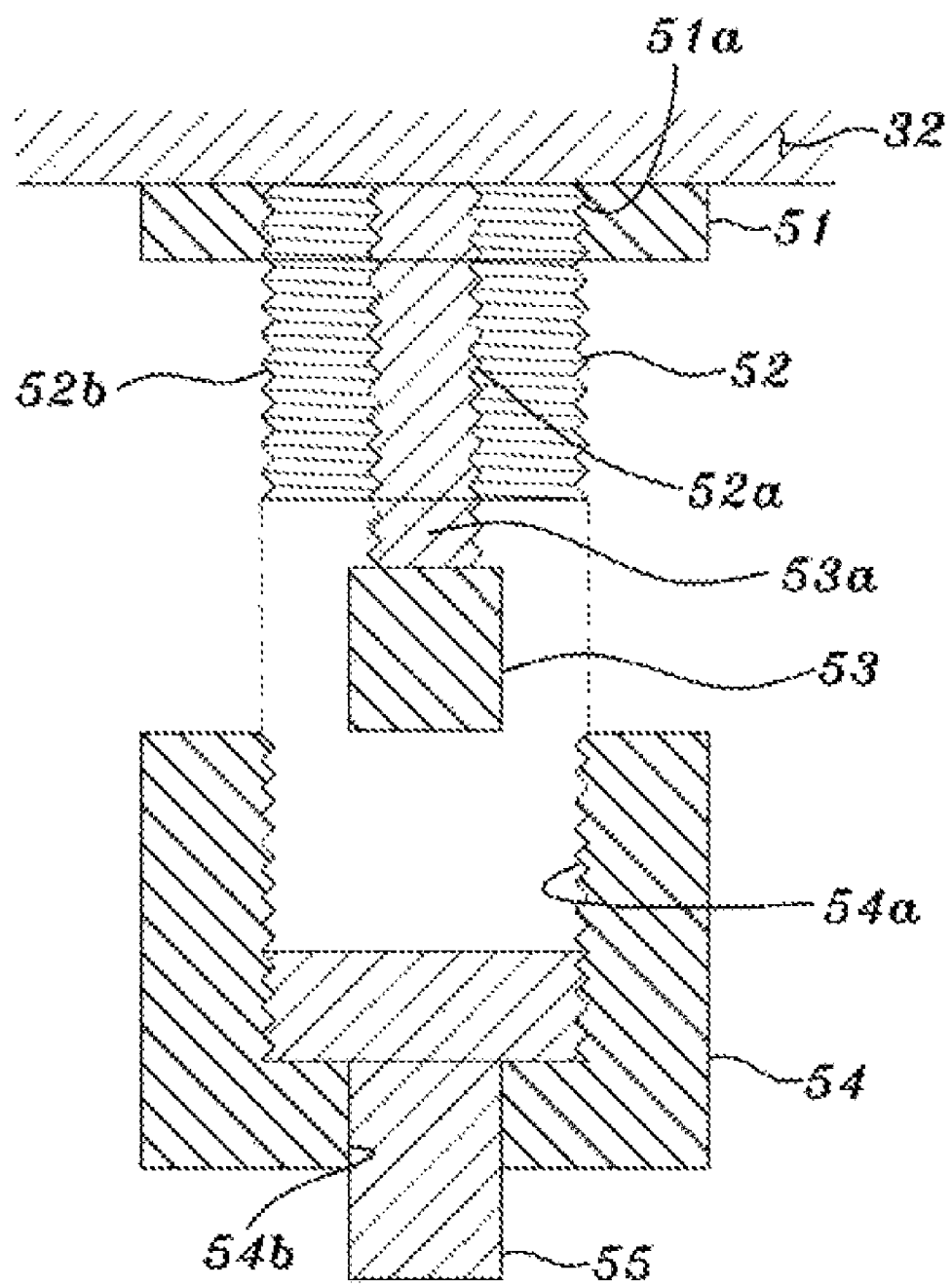
FIG. 11C is an assembled cross-sectional view of the UV emitter of FIG. 11B.
Figure 11D:
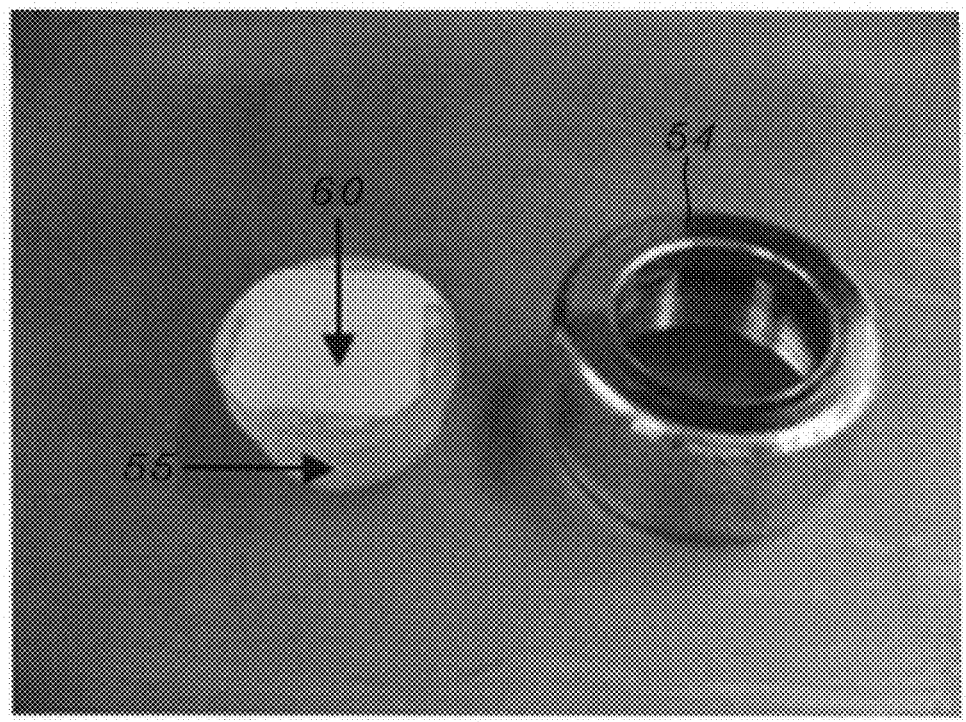
FIG. 11D is a photograph showing a jig, the quartz shaft and a fine haze diffuser film (FHDF) included in the UV emitter as shown in FIG. 11B.

It is impossible for the UV fiber source 40 to uniformly apply the UV light to a larger area due to its property. Therefore, a fine haze diffuser film (FHDF) 60 is attached to the upper surface of the quartz shaft 55 for scattering the UV source to thereby uniformly apply the UV light to the samples 2, 3 underneath as illustrated in FIG. 11D.

Figure 12A:
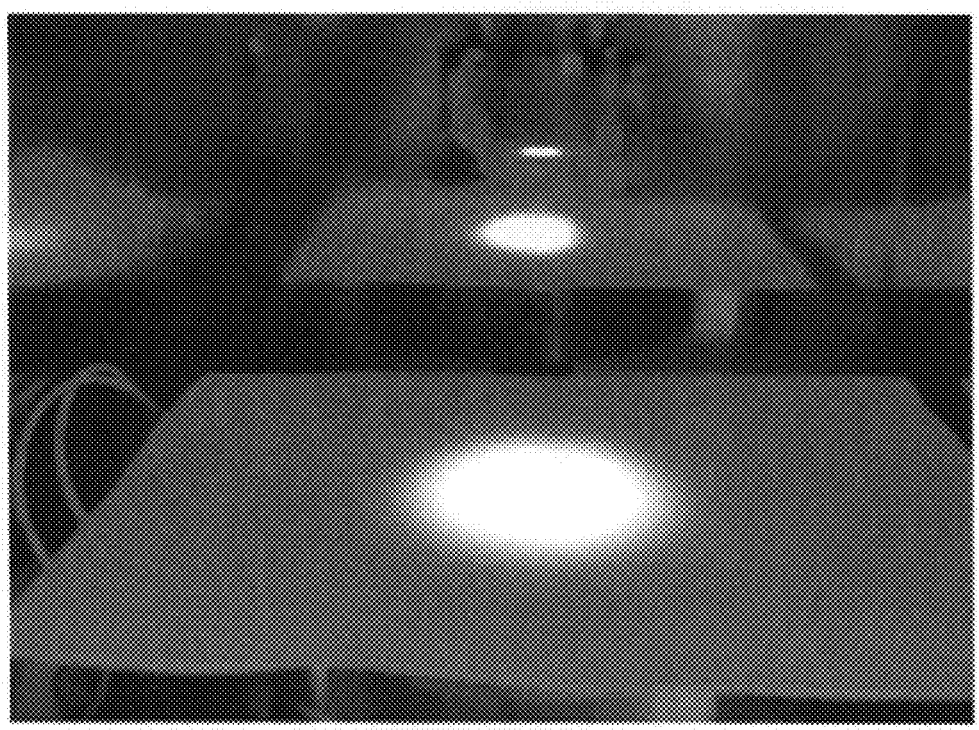
FIGS. 12A and 12B are photographs illustrating UV source distribution before and after application of the FHDF as shown in FIG. 11D.
Figure 12B:
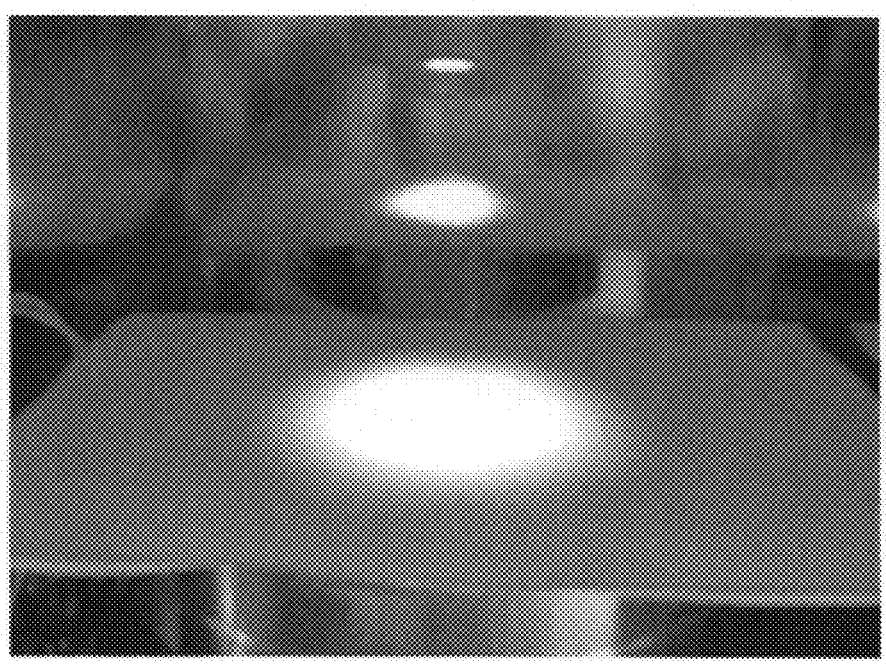
Figure 13:
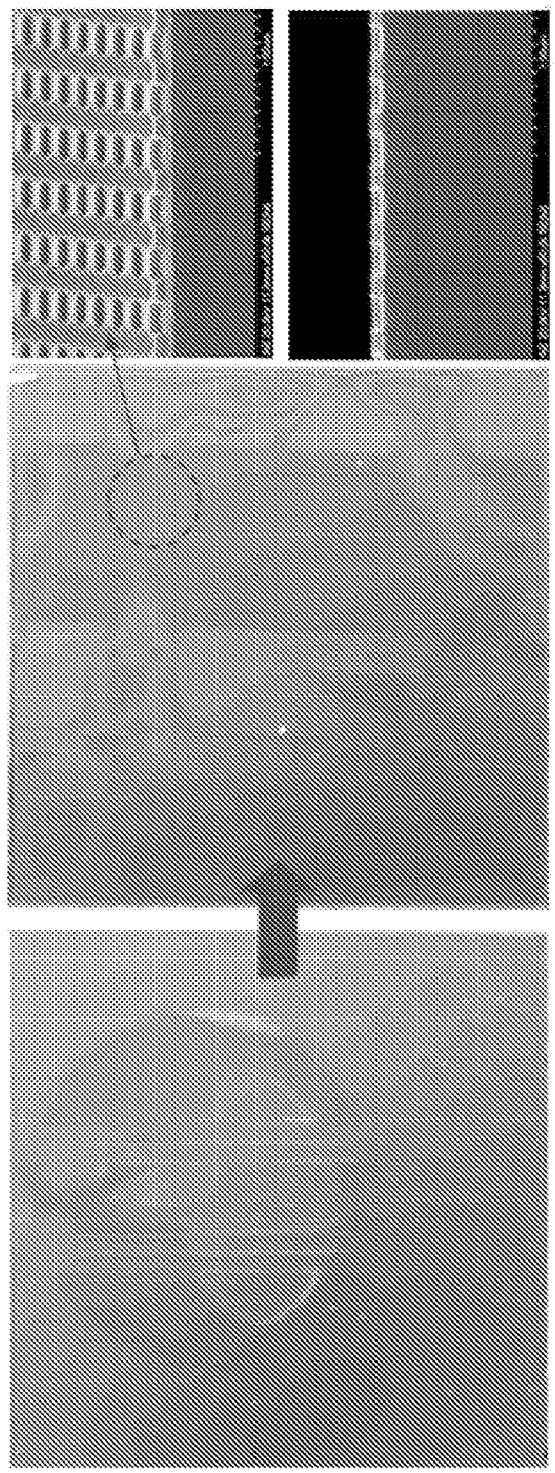
FIG. 13 is a photograph showing the result of the NIL process after applying the uniform UV source according to an embodiment of the present invention.

FIGS. 12A and 12B illustrate distributions of the UV source before and after attachment of the FHDF. FIG. 12A illustrates the application of the UV source with the power of 183 mW for 20 seconds. As illustrated in FIG. 12B, it can be ascertained that the attachment of the FHDF lets the UV light power decrease, but spreads to be broadly distributed. FIG. 13 illustrates the result of the NIL process according to embodiments of the present invention. As may be seen herein, the uniform application of the UV source is available, so that the complete patterning is attained without the non-patterned region. Also, as may be appreciated from the SEM measurement, the uniform pattering results without residual resin layer.

As described herein before, the present invention solves such problems as the tilt and the de-centering, which were mechanically unavoidable in the prior art, so that it is possible to remove residual resin layer and to perform the pressing process between the samples and the mold in the vacuum environment to thereby address such a non-uniform pattern which may be caused by air trap.

Furthermore, since the application of the UV source with a higher power to the samples is available, the uniform pattern transfer is possible for a short period of the UV curing, and thus the duration needed for performing the NIL process on a larger area and the duration for the overall processes are significantly decreased.

Although the process and the apparatus for performing the UV nano-imprint lithography have been described for illustrative purposes, those skilled in the art will appreciate that various modifications, additions and substitutions are possible, without departing from the scope and spirit of the invention as disclosed in the accompanying claims.

What is claimed is:

1. An apparatus for producing a patterned substrate, the apparatus comprising: a vacuum chamber; a tilt and de-centering corrector received in the vacuum chamber, the tilt and de-centering corrector adjusting an alignment of an assembly of a substrate and a resin layer; a UV emitter provided on the tilt and de-centering corrector; and, a UV fiber source which supplies UV light to the UV emitter, wherein the apparatus produces a pattern on the substrate, the pattern being a replica of a template pattern provided on a mold, and the pattern on the substrate is made of the resin layer; wherein the tilt and de-centering corrector comprises: a base plate having on its upper surface a concave recess with a curvature; a loading plate disposed over the base plate; a ball placed between the base plate and the loading plate, the ball is in at least partial contact with the base plate and the loading plate; a centering guide disposed over the loading plate and formed with a nesting recess on an upper surface thereof, the centering guide receiving the assembly of the substrate and the resin layer; a plurality of centering guide rods disposed around the centering guide; a mold loading plate provided on the centering guide rod; and a mold arranged on the mold loading plate, the mold having a template pattern.

2. The apparatus as claimed in claim 1, wherein the mold loading place is provided on the centering guide rod through an elastic means.

3. The apparatus as claimed in claim 1, wherein the loading plate comprises a receiving recess and a guide member is mounted on the loading plate around the receiving recess.

4. The apparatus as claimed in claim 1, wherein the concave recess has a width larger than that of the ball.

5. The apparatus as claimed in claim 1, wherein the assembly of the substrate and the resin layer further comprises a pad made from polydimethylsiloxane.

6. The apparatus as claimed in claim 5, wherein the assembly is received in the centering guide, the pad being placed on the bottom and the resin layer being placed on the top.

7. The apparatus as claimed in claim 1, wherein the UV emitter comprises: a support member; a fitting member coupled to the support member; a UV emitting device coupled to an end of the fitting member; and a jig having a shaft provided inside thereof, the shaft applying pressure to the mold to bring the mold to be in contact with the assembly; wherein the fitting member is coupled to the jig.

8. The apparatus as claimed in claim 7, wherein the support member has threads formed on inner circumference thereof; the fitting member is threaded into the support member; the UV emitting device having an end threaded into the fitting member; and the fitting member is threaded in the jig.

9. The apparatus as claimed in claim 7, wherein the support member and the fitting member each have annular shapes.

10. The apparatus as claimed in claim 7, further comprising a fine haze diffuser film (FHDF) mounted on an upper surface of the shaft.

* * * * *